April 17, 1956 D. M. HODGIN 2,742,569

OSCILLATOR CIRCUIT

Filed Aug. 30, 1950

INVENTOR.
DAVID M. HODGIN
BY Marvin Moody
Atty.

2,742,569
Patented Apr. 17, 1956

2,742,569

OSCILLATOR CIRCUIT

David M. Hodgin, Cedar Rapids, Iowa, assignor to Collins Radio Company, Cedar Rapids, Iowa, a corporation of Iowa Application August 30, 1950, Serial No. 182,229

1 Claim. (Cl. 250—36)

Figure 1:
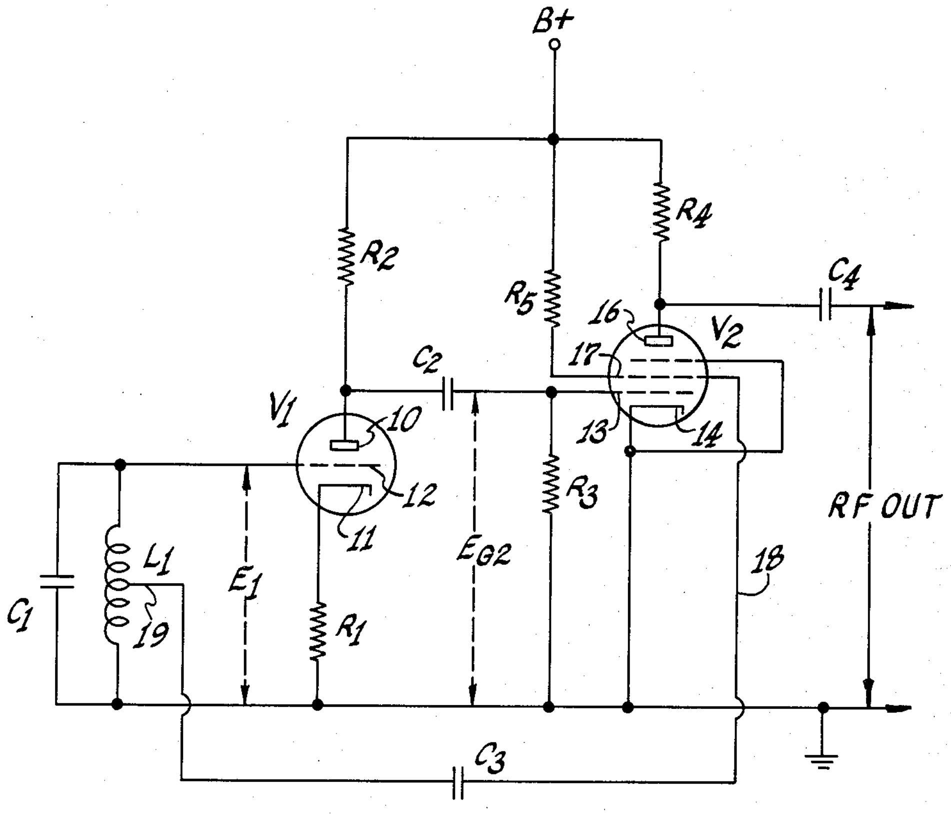

This invention relates in general to oscillator circuits, and in particular to an oscillator which utilizes a stabilizer tube between the oscillating elements and the oscillator tube.

Sources of alternating signals are very important in the field of electronics today. It is also very important that the oscillations generated remain substantially constant at a predetermined frequency. The stability of the oscillator determines the stability of the output signal. Oftentimes a tank circuit comprising an inductance and capacitance is used to generate the desired oscillations and the output of the tank circuit is fed to an amplifier in order to obtain an appreciable signal that may be used. The inter-electrode capacitance of the amplifier changes with temperature and reflects back into the tank circuit so that a change of frequency occurs in response to change of the inter-electrode capacitance of the amplifier. The input capacity of the amplifier also varies with its gain, and since the tube may not always be operating in the linear portion of its characteristic curve, the gain and, consequently, the capacitance, will vary.

It is an object of this invention, therefore, to provide an oscillator in which changes of inter-electrode capacitance in the amplifier will not appreciably change the frequency of the tank circuit.

Another object of this invention is to provide an improved oscillator which has a stability of a high degree and wherein the variations in load cause a minimum amount of frequency shift.

Still another object of this invention is to provide means for stabilizing the effect of the oscillator tube on the oscillating elements.

A feature of this invention is found in the provision for a stabilizer tube which receives an output from a tank circuit and supplies an output to an oscillator tube. The oscillator receives an input from the plate of the stabilizer tube and a feed-back is furnished to the tank circuit from the oscillator tube.

Further objects, features, and advantages of this invention will become apparent from the following description and claim when read in view of the drawings, in which;

The figure is a wiring diagram illustrating the oscillator of this invention.

A tank circuit which has one side grounded and comprising the condenser $C_1$ and the inductance $L_1$ produces an output voltage $E_1$ whose frequency depends primarily on the values of $C_1$ and $L_1$. A tube $V_1$ comprising a plate 10, cathode 11, and grid 12 receives voltage $E_1$ on its grid. A cathode resistor $R_1$ is connected between the cathode 11 and ground. A resistor $R_2$ is connected between the plate 10 of tube $V_1$ and B plus.

A second tube $V_2$ receives on its control grid 13 a signal from the plate 10 of $V_1$ through a blocking condenser $C_2$. A grid leak resistor $R_3$ is connected between grid 13 and ground. The cathode 14 of tube $V_2$ is connected to ground and a resistor $R_4$ is connected between B plus and the plate 16. The screen grid 17 of tube $V_2$ is connected by a lead 18 through a blocking condenser $C_3$ to a tap 19 on the inductance $L_1$. A resistor $R_5$ is connected between the screen grid 17 and B plus. It is to be noted that the grid 17 is not grounded, and thus is allowed to vary at a radio frequency rate.

The output of the oscillator is taken from the plate 16 of tube $V_2$ through the blocking condenser $C_4$.

An example of usable values of the circuit components are:

Tube $V_1$ may be a 6C4
Tube $V_2$ may be a 6AU6
$R_1$—3300 ohms
$R_2$—1000 ohms
$R_3$—150,000 ohms
$R_4$—10,000 ohms
$R_5$—56,000 ohms
B plus may be 200 volts
$C_1$—570 micromicrofarads
$C_2$—50 micromicrofarads
$C_3$—0.01 microfarad
$C_4$—100 micromicrofarads
$L_1$ is variable so that the oscillator may be tuned The voltage $E_1$ developed across the tank circuit is fed to the control grid 12 of tube $V_1$. The value of $R_2$ is less than $R_1$ and, therefore tube $V_1$ is operating at less than unity gain than in the linear portion of its characteristic curve. It is a linear class A amplifier with a gain of less han one. A 180 degree phase shift occurs in the applied signal between the control grid 12 and the plate 10.

The plate output of tube $V_1$ is supplied to the grid 13 of tube $V_2$ through the condenser $C_2$. The values of $C_2$ and $R_3$ are chosen so that negligible phase shift occurs between plate 10 and grid 13.

Tube $V_2$ draws grid current on the positive voltage peaks. Since grid current is drawn the amplitude of the oscillation is self-limited.

The screen grid 17 is not grounded to radio frequency and is allowed to vary at any radio frequency rate.

A 180 degree phase shift occurs between the grid 13 and the screen grid 17. Thus, the voltage fed back through the lead 18 to the tank circuit is in phase with the voltage $E_1$ and thus adds directly with the voltage developed across the tank circuit and sustains oscillation as long as the over-all gain of the system is sufficient to overcome the combined losses of the system.

The stability of this oscillator is two to five times better than an oscillator which comprises merely a tank circuit and an oscillator tube. The increase in stability is due to the following factors:

1. The input capacity of tube $V_1$ varies very little with changes of filament and plate voltages. The reason for this is that the input capacity of a tube is equal to the capacitance from grid to cathode plus the capacitance from grid to plate plus the gain of the tube multiplied by the capacitance from grid to plate. In that the gain of the degenerative class A tube $V_1$ is less than one, variation of gain does not appreciably change the input capacity. Also, since tube $V_1$ operates in the linear portion of its characteristic curve, changes of filament and plate voltage do not appreciably effect the gain of the tube.

2. Since the grid 12 of the tube $V_1$ does not draw grid current at any time, there are no grid current pulses flowing through $L_1$ to ground. Such grid pulses introduce additional harmonic voltages in the tank circuit and such harmonic content has been shown by Llewelyn to increase instability. (See Constant Frequency Oscillator—Proceedings of I. R. E. vol. 19, No. 12, Dec. 30, 1930.)

3. The input capacity changes of tube $V_2$ are effectively blocked out by tube $V_1$, since it is effectively in series with the grid to ground input capacity of tube $V_1$. This reduces the effective capacity change.

Thus, it is seen that the addition of the stabilizer tube $V_1$, which operates with a low gain, appreciably cuts down the capacitance changes of tube $V_2$ that would normally cause a change in the frequency of oscillation of the tank circuit. The stabilizing action of tube $V_1$ will minimize frequency shift as the load from the oscillator is varied.

Although this invention has been described with respect to a preferred embodiment thereof, it is not to be so limited as changes or modifications may be made therein which are within the full intended scope of the invention as defined by the appended claim.

I claim:

An oscillator circuit comprising, a tank circuit having one end grounded, a first phase-inverting amplifier having an electron tube with at least a control grid, wherein the control grid is connected to the ungrounded side of the tank circuit, said phase-inverting amplifier having a voltage gain of less than one to minimize its input plate-to-grid interelectrode capacitance, a second phase-inverting amplifier having an electron tube with at least a control grid and a screen grid, wherein the control grid of the second electron tube is connected to receive the plate output of the first electron tube, and feedback means coupled between the screen grid of the second electron tube and the tank circuit to provide oscillatory positive feedback, whereby a load connected to the plate of the second amplifier is isolated from the tank circuit through the large plate-to-grid impedance of the first amplifier.

References Cited in the file of this patent

UNITED STATES PATENTS

| | | |
|---|---|---|
| 2,251,025 | Albricht | July 29, 1941 |
| 2,269,417 | Crosby | Jan. 6, 1942 |
| 2,447,248 | Harris | Aug. 17, 1948 |
| 2,519,305 | Young | Aug. 15, 1950 |

OTHER REFERENCES

"Radio Amateur's Handbook," published by the American Radio Relay League, 1946 (page 94).